United States Patent
Alvarez (10) Patent No.: US 10,865,640 B2
(45) Date of Patent: Dec. 15, 2020

(54) DOWNHOLE TOOL WITH CATR

(71) Applicant: Saudi Arabian Oil Company, Dhahran (SA)

(72) Inventor: Jose Oliverio Alvarez, Houston, TX (US)

(73) Assignee: Saudi Arabian Oil Company, Dhahran (SA)

( * ) Notice: Subject to any disclaimer, the term of this patent is extended or adjusted under 35 U.S.C. 154(b) by 28 days.

(21) Appl. No.: 16/380,806

(22) Filed: Apr. 10, 2019

(65) Prior Publication Data

US 2020/0325771 A1 Oct. 15, 2020

(51) Int. Cl.
| | |
|---|---|
| *E21B 47/00* | (2012.01) |
| *G01V 3/30* | (2006.01) |
| *E21B 49/00* | (2006.01) |
| *E21B 47/14* | (2006.01) |
| *E21B 47/13* | (2012.01) |
| *G01V 1/50* | (2006.01) |

(52) U.S. Cl.
CPC ............ *E21B 49/003* (2013.01); *E21B 47/13* (2020.05); *E21B 47/14* (2013.01); *G01V 3/30* (2013.01); *G01V 1/50* (2013.01); *G01V 2200/16* (2013.01); *G01V 2210/6169* (2013.01)

(58) Field of Classification Search
CPC ... G01V 3/12; G01V 3/18; G01V 3/20; G01V 3/26; G01V 3/30; G01V 3/08; G01V 3/083; E21B 47/00; E21B 49/00
See application file for complete search history.

(56) References Cited

U.S. PATENT DOCUMENTS

| | | | |
|---|---|---|---|
| 6,100,696 A * | 8/2000 | Sinclair .................... | G01V 3/28 324/339 |
| 6,534,980 B2 | 2/2003 | Toufaily et al. | |
| 7,376,514 B2 | 5/2008 | Habashy et al. | |
| 8,237,444 B2 | 8/2012 | Simon | |
| 8,794,062 B2 | 8/2014 | DiFoggio et al. | |
| 8,884,624 B2 | 11/2014 | Homan et al. | |
| 9,057,799 B2 * | 6/2015 | Allen ....................... | G01V 3/28 |
| 9,556,726 B2 * | 1/2017 | Kouchmeshky ......... | G01V 3/12 |
| 9,562,987 B2 | 2/2017 | Guner et al. | |
| 9,989,666 B2 * | 6/2018 | Terentev .................. | G01V 3/30 |
| 10,082,530 B1 | 9/2018 | Teremce et al. | |
| 10,401,203 B2 * | 9/2019 | Fanini ...................... | G01F 1/74 |
| 2006/0016592 A1 | 1/2006 | Wu | |
| 2008/0047337 A1 | 2/2008 | Chemali et al. | |
| 2010/0025112 A1* | 2/2010 | Sroka ...................... | G01N 21/43 175/49 |

(Continued)

FOREIGN PATENT DOCUMENTS

CN 104698501 3/2017

OTHER PUBLICATIONS

Carpenter, "Advancing Deepwater Kick Detection", JPT, vol. 68, Issue 5, May 2016, 2 pages.

(Continued)

*Primary Examiner* — Kenneth L Thompson
(74) *Attorney, Agent, or Firm* — Fish & Richardson P.C.

(57) ABSTRACT

A system, downhole tool, and method for lowering the downhole tool having a compact antenna test range (CATR) system into a wellbore in a geological formation to monitor a property downhole in the wellbore via the downhole tool.

21 Claims, 6 Drawing Sheets

(56) References Cited

U.S. PATENT DOCUMENTS

| | | | |
|---|---|---|---|
| 2010/0071894 A1* | 3/2010 | Benischek | E21B 47/113 |
| | | | 166/248 |
| 2013/0118734 A1* | 5/2013 | Csutak | E21B 49/10 |
| | | | 166/264 |
| 2014/0291023 A1 | 10/2014 | Edbury | |
| 2016/0033675 A1* | 2/2016 | Csutak | G01V 7/04 |
| | | | 356/452 |
| 2016/0237810 A1 | 8/2016 | Beaman et al. | |
| 2016/0363686 A1* | 12/2016 | Kouchmeshky | H01Q 1/04 |
| 2018/0187498 A1 | 7/2018 | Soto et al. | |
| 2019/0036621 A1 | 1/2019 | VanWiggeren | |

OTHER PUBLICATIONS

Johnson et al., "Advanced Deepwater Kick Detection," IADC/SPE 167990, presented at the 2014 IADC/SPE Drilling Conference and Exhibition, Mar. 4-6, 2014, 10 pages.

Olver A. D., ., "Compact Antenna Test Ranges," Seventh International Conference on Antennas and Propagation IEEE, Apr. 15-18, 1991, 10 pages.

Parini et al., "Chapter 3: Antenna measurements," in Theory and Practice of Modern Antenna Range Measurements, IET editorial, 2014, 30 pages.

petrowiki.org [online], "Kicks," Petrowiki, available on or before Jun. 26, 2015, retrieved on Jan. 24, 2018, retrieved from URL <https://petrowiki.org/Kicks>, 6 pages.

rigzone.com [online], "How does Well Control Work?" Rigzone, available on or before 1999, retrieved on Jan. 24, 2019, retrieved from URL <https://www.rigzone.com/training/insight.asp?insight_id=304&c_id>, 5 pages.

PCT International Search Report and Written Opinion issued in International Application No. PCT/US2020/027366 dated Jul. 21, 2020, 15 pages.

Mvg, "Compact Range Overview," www.mvg-world.com/CR, Dec. 31, 2018, 16 pages.

* cited by examiner

DOWNHOLE TOOL WITH CATR

TECHNICAL FIELD

This disclosure relates to a system and method for downhole liquid characterization, gas kick detection, and geological formation evaluation.

BACKGROUND

Downhole tools may refer to the equipment employed in the production of oil and gas, well drilling, well interventions, and well completions. Downhole tools may be oilfield equipment utilized during drilling, completion, and intervention in optimizing production levels and maintaining a flow of production fluids from a reservoir. Downhole tools may examine reservoir properties involving rock, sand, and fluid. Some downhole tools may bring samples to the well surface.

Downhole tools as logging tools are employed in wellbores to perform formation evaluation measurements to infer properties of the formations surrounding the borehole and of the fluids in the formations. Logging tools include electromagnetic tools, nuclear tools, and nuclear magnetic resonance (NMR) tools. Logging tools may be run into a wellbore on a wireline cable including after the wellbore had been drilled. Further, the desire for downhole information while drilling the borehole has given rise to downhole tools that are measurement-while-drilling (MWD) tools or logging-while-drilling (LWD) tools. By collecting and processing such information during the drilling process, the driller can modify or correct steps of the operation to improve performance.

SUMMARY

An aspect relates to a method of downhole monitoring, including lowering a downhole tool having a compact antenna test range (CATR) system into a wellbore in a geological formation. The method includes monitoring a property downhole in the wellbore via the downhole tool.

Another aspect relates to a method of downhole monitoring, including deploying a downhole tool having a CATR system into a wellbore in a geological formation. The CATR system includes a source antenna, a metallic reflector, a receiver antenna, and an electromagnetic (EM) radiation absorbent material. The method includes monitoring permittivity downhole in the wellbore via the downhole tool.

Yet another aspect relates to a downhole tool having a body and a coupler to connect the body to a deployment extension that lowers the downhole tool into the wellbore. The downhole tool includes a CATR system associated with the body to measure permittivity downhole in the wellbore. The CATR system includes a source antenna, a metallic reflector, a receiver antenna, and EM radiation absorbent material.

The details of one or more implementations are set forth in the accompanying drawings and the description. Other features and advantages will be apparent from the description and drawings, and from the claims.

BRIEF DESCRIPTION OF DRAWINGS

Like reference numbers and designations in the various drawings indicate like elements.

DETAILED DESCRIPTION

A compact antenna test range (CATR) may generally be a facility employed to provide testing of antenna systems at frequencies where obtaining far-field spacing might be infeasible. The CATR may utilize a source antenna which may radiate a spherical wavefront and one or more secondary reflectors to collimate the radiated spherical wavefront into a planar wavefront within the desired test zone. One typical example employs a horn feed antenna and a parabolic reflector. The CATR may be utilized for microwave and millimeter wave frequencies. The size of the range employed can generally be less than the size for a full-size far-field anechoic chamber. The CATR may utilize a specially-designed reflector with precision-formed reflecting surface and having a reflector edge specially treated to avoid diffracted waves that can interfere with the desired beam pattern.

An antenna is a device that serves as interface between an electric circuit and space, and may be designed to transmit or receive electromagnetic (EM) waves within a certain frequency range such as according to antenna size and form. Moreover, the near field area of an antenna may be where the reactive fields looping back to the antenna predominate. In the near field, an object may disturb antenna behavior and characteristics. Conversely, the far field area of an antenna is where radiating fields not going back to the antenna predominate. An object in the far field generally does not disturb the antenna. An object in the far field may disturb the propagation of the EM waves coming from the antenna but does not disturb the antenna properties.

In general, a CATR may facilitate antennas to be measured at a shorter distance than a traditional far-field test range. An example megahertz (MHz) range is 700 MHz to 110,000 MHz. Compact ranges may employ a source antenna (feed) to radiate a spherical wave in the direction of a parabolic reflector, collimating the wave into a planar wave for aperture illumination of a device under test (DUT). The least operational frequency may be determined by reflector size and edge treatment, and absorbers in the CATR chamber. Example edge treatments of the reflector are serrated edge for general purpose applications and rolled edge to achieve greater accuracy for special applications. Multiple-feed systems may be employed to improve the far-field characteristics.

The present disclosure is generally directed to a downhole tool having a CATR system. Some aspects of the present disclosure are directed to a downhole tool employing CATR for fluid or liquid characterization, gas kick detection, or formation evaluation, or any combinations thereof. The downhole tool may be a wireline tool or a logging-while-drilling (LWD) tool. The downhole tool includes a CATR system with at least one reflector. An advantage may be that the CATR can generate a plane wave analogous in far field of the antenna but with the CATR facilitating a more accurate inversion (for example, inversion of the S21 parameter). As indicated, CATR is typically employed to test antennas in anechoic chambers and to measure radar cross section.

In embodiments, the CATR system of the downhole tool can be configured such that the EM wave (for example, microwave or millimeter) travels parallel or perpendicular to the flow of fluids travelling in the wellbore. The wellbore fluids may be drill mud, production fluids, or any other fluid typically found in a wellbore. In certain instances, the reflector can be pointed to the formation and the receiver placed within a number of wavelengths for formation evaluation purposes. In some LWD cases, when the sensors (for example, antenna and circuitry) determine or detect a change in permittivity due to gas invasion (kick), an alarm signal may be sent up the wellbore to alert the drilling operator. Thus, implementations of this tool may give the driller adequate time to shut-in the well and initiate or implement kick management.

In order to reduce stray signals from the environment, a radio-frequency (RF) anechoic chamber is typically employed for a CATR. A RF anechoic chamber is a room or space designed to absorb reflections of EM waves and may isolate from waves entering from the surroundings. The interior surfaces of the RF anechoic chamber are generally covered with radiation absorbent material (RAM). In embodiments, at least a partial implementation of such an anechoic chamber is employed.

During drilling operations, as indicated earlier, the drill bit may encounter pressurized gas zones. Thus, in those instances, pressurized formation gas may enter the wellbore and travel up to surface, expanding in the process. This phenomena may be called a gas kick or simply getting a kick. Again, gas kicks may be related to well control implementing adequate weight on the drill mud to maintain formation fluids (for example, gas or water, or both) in the formation. There are mechanical mechanisms to deviate kicks through alternate routes. In some instances, kicks can be detected with sufficient time to respond by observing fluid levels in the mud tank. The driller may be informed to shut close the annulus of the drill pipe and formation. Yet, unfortunately, the kick may not be detected early and thus an emergency procedure is instigated such as adding kill-weight mud to balance the bottomhole pressure or closing the blowout preventer (BOP). Embodiments of the downhole tool monitor the drilling fluid to provide for early detection of a gas kick.

Furthermore, the issue of water breakthrough from the geological formation into the wellbore may be considered by different disciplines. Water breakthrough from injecting wells may cost millions of dollars in lost production. Early detection of water in or adjacent the wellbore may give the reservoir engineer adequate time to react to the increase production. By monitoring EM properties of downhole production fluid, early water breakthrough can be detected.

Figure 1:
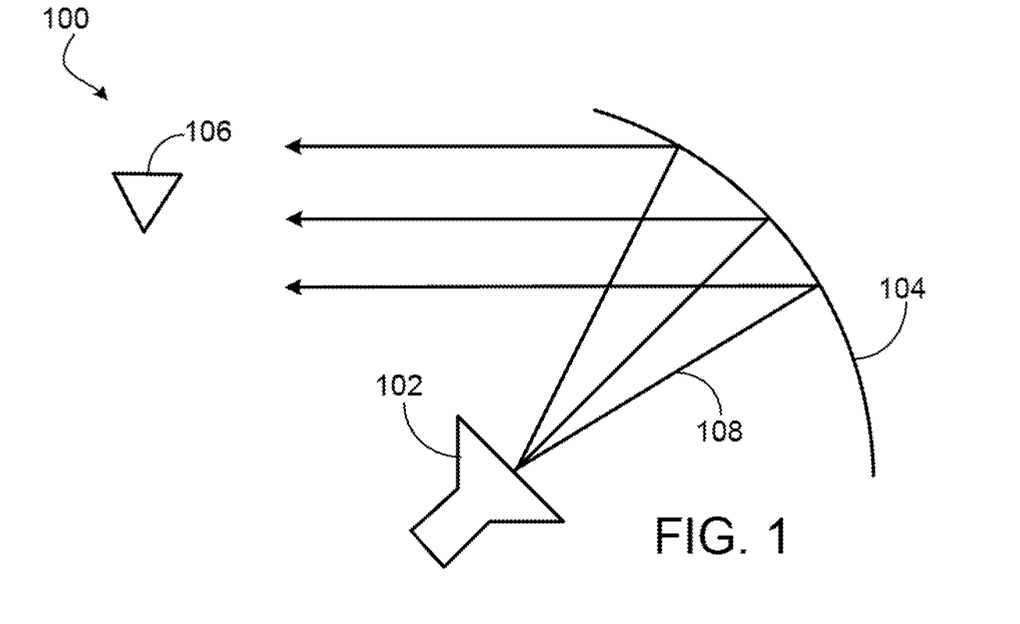
FIG. 1 is a diagram of a compact antenna test range (CATR) system.

Turning now to the drawings, FIG. 1 is some components of a CATR system 100. The system includes a source antenna 102, a metallic reflector 104, and a receiver antenna 106. The source antenna 102 may provide broadband EM feed 108. The broadband EM feed 108 may be, for example, microwave. The metallic reflector 104 may be parabolic or hyperbolic, and with edge treatment. In operation, the source antenna 102 emits the broadband EM feed 108 which is reflected by the reflector 104 to the receiver antenna 106. Embodiments of the present downhole tool can include versions of these components.

Implementations can include a downhole tool with a metal housing and that is generally cylindrical with a typical diameter as other LWD/wireline tools. The housing may be metal or other material such as polymer, plastic, or composite, to resist damage from drill cuttings, erosion, and chemical reactions to protect the electronics of the tool. In one embodiment, the tool has a dent or step into the diameter (see, for example, FIG. 4), forming an open cavity in which a broadband microwave feed and a metallic reflector are disposed. The broadband microwave feed may be a source antenna. The metallic reflector may be parabolic or hyperbolic, and with edge treatment. In examples, a receiver antenna may be placed in the plane wave zone, called the quiet zone. The quiet zone may be associated with a test zone. The diameter or height of the quiet zone may be a certain percentage size (for example 50%-60%) of the diameter or height of the reflector.

Figure 2:
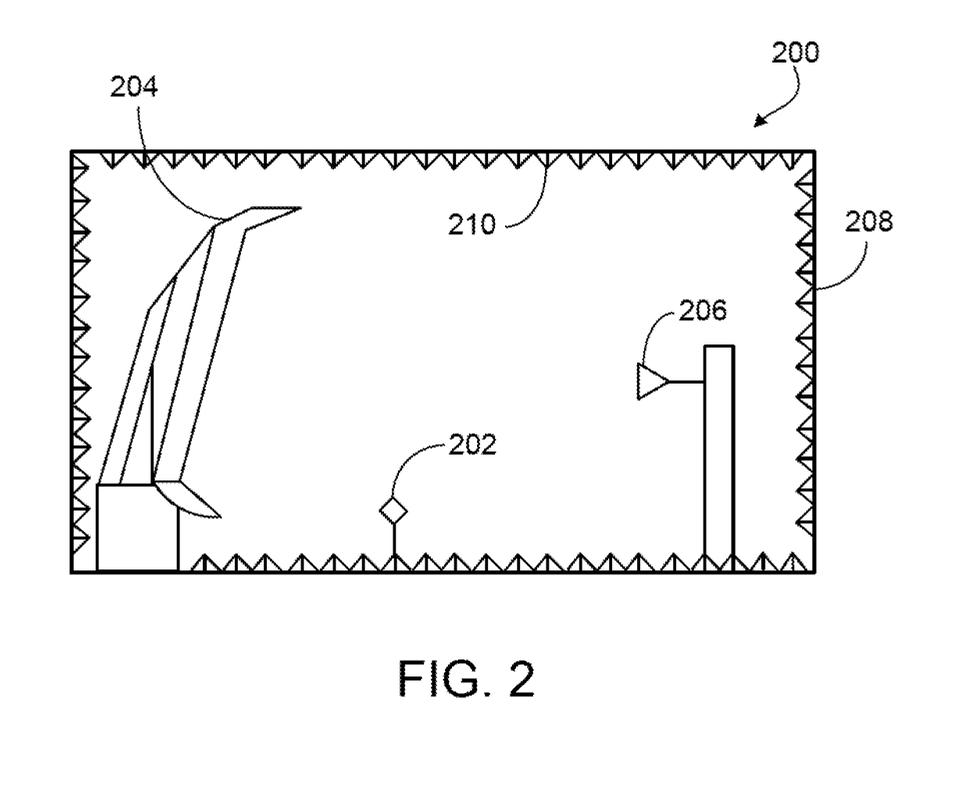
FIG. 2 is a diagram of a CATR system.

Again, these components are depicted as representations generally in FIG. 1 and not depicted disposed inside a cavity or open cavity of a downhole tool. Moreover, as discussed, a CATR system will typically have absorbing material to avoid reflections from walls (spillover) and leakage, for example, from a signal generator and internal circuitry. FIG. 2 depicts an example representation of a CATR system having such an anechoic chamber.

FIG. 2 is a CATR system 200 having a source antenna 202, a reflector 204, and a receiver antenna 206. In examples of operation, the source antenna 202 may emit EM waves such as in the millimeter or microwave ranges.

The reflector 204 may be a metallic reflector and with edge treatment. The edge treatment may include serrated edges or rim serrations, rolled edges, edge taper, or resistive sheets (R-cards) along the reflector edge. In operation, the reflector 204 receives and then reflects the EM waves emitted by the source antenna 202. The reflector edge treatment and rim shape may control or reduce reflector edge diffraction such as to reduce the edge-diffraction field inside the quiet zone of the CATR. The size of the reflector 204 and size of the edge-treatment (for example, serrations) may depend on the frequency range of interest or, inversely, the frequency range employed may depend on the reflector(s) 204 and edge-treatment size.

The receiver 206 may generally be a receiver antenna. In operation, the receiver 206 receives the EM waves reflected by the reflector 204. The determination of the measured property may be based on a signal generated by the receiver 206.

The system 200 includes an anechoic chamber 208 having absorbing material 210 disposed on inner surfaces of the anechoic chamber 208. The absorbing material 210 may be RAM or an EM-wave absorbent material for RF radiation in the millimeter or microwave ranges.

For certain embodiments of the downhole tool, certain walls including of a cavity of the downhole tool are covered at least partially with EM wave absorbing material. In some examples, the geological-formation side of the cavity may generally not be covered with absorbing material. However, decay and reflection losses are beneficially expected with respect to the formation side.

As discussed later, some embodiments of the deployed downhole tool may have the drill mud or production fluids flowing through a pseudo conduit of the downhole tool where the transmitter and receivers are on opposite sides of the conduit. For example, the source may be a central portion of the tool and the receiver is at the wall on the side of the formation. See, for example, FIG. 6.

The downhole tool may include a hardware processor to convert the complex S21 signal to permittivity. Thus, the downhole tool may determine permittivity of the wellbore fluid. In determining the permittivity, the downhole tool may determine or detect that the permittivity has a predetermined signature such as a predetermined signature related to an amount of gas or water. With such detection, gas kicks or water fronts can be identified because gas generally has less permittivity than water, and water generally has a greater permittivity than oil. The permittivity determined or measured may be complex permittivity or absolute permittivity.

In addition, when a plane wave or plane wave front is directed towards the geological formation, the reflection wave properties may aid understanding of the fluid content of the face of the formation. For example, the downhole tool in a formation evaluation (FE) environment may identify productive or "sweet spots" and proactively detect water increase in the face of the formation.

In one embodiment, the downhole tool via its CATR system may monitor for changes from the baseline signal of the drill mud or production fluids. As mentioned for the drilling case, the downhole tool via its CATR system may monitor for gas kicks. The gas may come into the wellbore and be mixed via drill pipe rotation with the drill mud. The change in permittivity of the drill mud (drilling fluid) may be sensed by the receiver of the CATR system. The data can be collected in memory in order not to interfere with the other LWD tools data transmission. If a kick event is detected, a signal of the kick detection may be sent, for example, through the mud pulse system with little or no detriment of any other tools signals. Such as alert may give the driller time to start a kick containment procedure or similar procedure.

For examples of the present downhole tool employed via a wireline such as with a production logging tool, the CATR system can establish a baseline signal and look for any changes due to the presence of water. Also, in certain implementations, the CATR system of the downhole tool can be used to penetrate the geological formation a few millimeters to detect any changes in the fluid composition in the formation. This may detect water intrusion in a more proactive manner. In all, embodiments of the downhole tool are an innovative technique for fluid characterization/monitoring and kick detection.

In summary, embodiments the present techniques include a downhole tool having a CATR system. In particular, examples of the downhole tool may include a metal housing, EM wave feed, metal reflector(s) with edge treatment, EM wave absorber material, a receiver antenna, internal circuitry and processor, a telemetry system, and a data storage system. The EM wave feed may be via a source antenna and in the millimeter range or microwave range.

Figure 3:
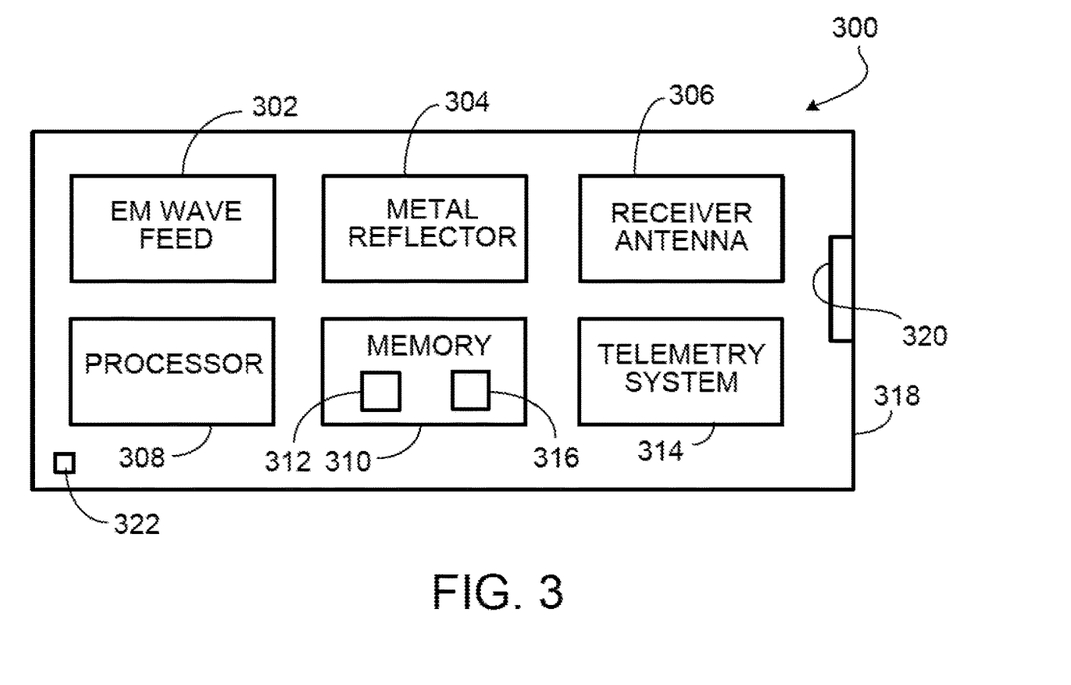
FIG. 3 is a block diagram of a downhole tool that includes a CATR system to measure a downhole property such as permittivity.

FIG. 3 is a block diagram of a downhole tool 300 that includes a CATR system to measure a downhole property such as permittivity. The permittivity may be absolute permittivity or complex permittivity. Complex permittivity is dimensionless and is also called relative permittivity. Complex permittivity is a complex value with the real part indicating the capacitance of the material and the imaginary part indicating the conductive or dielectric losses.

The downhole tool 300 includes an EM wave feed 302 as a component of the CATR system. The EM wave feed 302 may be a transmitting antenna or source antenna that emits EM waves such as in the millimeter or microwave ranges. In implementations, the source antenna may be a horn feed antenna or a pyramidal horn antenna. Furthermore, the EM wave feed 302 (source antenna) may have or be associated with a signal generator.

In general, an antenna may be a conductive structure in which an alternating electric current flows (RF signal) generates electric and magnetic fields that can escape from the structure into free space and become radiated fields. The strength of those fields may depend on the electric current magnitude and on antenna structure dimensions and characteristics. As mentioned, the source antenna 302 emits EM waves in microwave range or millimeter range, or a combination thereof. Microwaves are a form of EM radiation with wavelengths in a broad definition ranging from about one meter (m) to one millimeter (mm), or frequencies between 300 MHz or 1 meter (m) and 300 gigahertz (GHz) or 1 millimeter (mm). A more narrow definition is that microwaves range between 1 GHz to 100 GHz or with wavelengths between 0.3 m to 3 mm. An even more narrow definition is that microwaves are in the range of 3 GHz to 30 GHz, or 10 centimeters (cm) to 1 cm. The millimeter band or millimeter wave (MMW or mmW) may be, for example, in the range of 30 GHz to 300 GHz, or 10 mm to 1 mm.

The tool 300 includes a metal reflector 304 which may be, for example, a parabolic reflector or a hyperbolic reflector. Further, the metallic reflector 304 may have edge treatment such as a serrated edge or a rolled edge, or other type of edge treatment. In operation, the reflector 304 receives and reflects the EM waves. The CATR system may employ the reflector 304 to create a field near the structure (for example, fluid or formation) under test that appears approximately as a plane wave. A CATR may produce a nearly uniform plane wave in a short distance via a single reflector or a system of reflectors. The reflector 304 surface may be fabricated with precision to obtain fairly uniform amplitude distribution of the incident field at the test or receiver antenna 306.

The downhole tool 300 has a test antenna or receiver antenna 306 as a component of the CATR system. In operation, the receiver antenna 306 receives the EM waves reflected by the metal reflector 304. The downhole-tool CATR system may utilize the receiver antenna 306 to collimate the energy of a primary feed antenna (for example, source antenna 302) in a short distance. The receiver antenna 306 may be a precision antenna or a precision paraboloid antenna. The receiver antenna 306 may be disposed in a plane wave zone which is a quiet zone of the CATR system.

In general, an antenna may be a reciprocal device with respect to transmitting and receiving. Therefore, an antenna in a receiving mode may generate electric current in the antenna in response to received EM radiation. A receiving antenna may perform the reverse of the process performed by the transmission antenna. A receiver antenna may receive and convert EM waves or radiation into electric currents in an electric circuit connected to the antenna.

The downhole tool 300 includes the processor 308 to determine onset of a gas kick via the CATR system and to send an alert of the gas kick. The downhole tool 300 includes the processor 308 and memory 310 storing code 312 (for example, logic and instructions) executed by the processor 308 to perform or direct actions of the downhole tool 300. Such actions may include processing of signals or data in the monitoring or measuring of a property (for example, permittivity) of wellbore fluid or formation. The actions may also include facilitating the determination of onset of a gas kick and the electronic transmission of an alert of the impending gas kick. The determination of the gas kick may be, for example, in response to measuring a change in permittivity or a change in permittivity per time. A value or range of amount of the change in permittivity may be specified as a threshold to give the gas kick detection and alert.

The processor 308 may be one or more processors, and may have one or more cores. The hardware processor(s) 308 may include a microprocessor, a central processing unit (CPU), graphic processing unit (GPU), controller card, circuit board, or other circuitry. The memory 310 may include volatile memory (for example, cache or random access memory), nonvolatile memory (for example, hard drive, solid-state drive, or read-only memory), and firmware.

The downhole tool 300 may include a telemetry system 314 which may be an automated communications system by which measurements and other data collected by the downhole tool 300 are transmitted to remote receiving equipment for monitoring, data storage, analysis, and alerts or alarms. Data 316 including measurement data and other data may also be stored locally in memory 310 of the downhole tool 300.

The telemetry system 314 may employ wireless data transfer (for example, radio, ultrasonic, or infrared systems) and data transfer over other media. Other media may include telephone or computer network, optical link or other wired communications, Global System for Mobile (GSM) communications, or short message service (SMS).

The telemetry system 314 may convert measurements recorded by downhole tool 300 (for example, as a wireline or MWD tool) into a form for transmission to the surface. In the case of wireline logging, the measurements may be converted, for example, into electronic pulses or analog signals that are sent up the cable. In the case of MWD, the measurements may be converted, for example, into an amplitude or frequency-modulated pattern of mud pulses. Some LWD or MWD tools utilize wirelines run inside the drillpipe. Other LWD or MWD tools employ wireless telemetry in which signals may be sent as electromagnetic waves through the Earth.

The downhole tool 300 has a body 318. The body 318 may be a metal body or metal housing and may be generally cylindrical in shape in certain embodiments. The wellbore may be borehole (open hole) or a cased wellbore. A borehole can have a diameter, for example, in the range of 5 inches to 30 inches. Casing in a wellbore can have a nominal diameter as small as 4.5 inches. Thus, the outer diameter of the body 318 can be less than 4.5 inches.

A CATR system may be associated with the body 318. Again, the CATR may include the source antenna 302, the metallic reflector 304, the receiver antenna 306, and EM radiation absorbent material 320. The body 318 of some examples of a downhole tool 300 may include one or more cavities having components of the CATR system(s). See, for example, FIGS. 4-6.

The downhole tool 300 has EM radiation absorbent material 320 as a component of the CATR system. The EM radiation absorbent material 320 may be disposed on surfaces of the body 318 including on surfaces of the aforementioned one or more cavities. See, for example, FIGS. 4-6. A typical absorbing element of the EM radiation absorbent material 320 may have the form of a pyramid or a wedge. See, for example, FIG. 2 (210) and FIG. 4 (418). The downhole tool 300 may have the radiation absorbent material for a chamber or partial chamber that is anechoic.

The CATR system of the downhole tool 300 includes an anechoic chamber (or partial implementation of such a chamber) lined with the EM radiation absorbent material 320. As discussed, an anechoic chamber may absorb reflections of EM waves. The interior surfaces of the anechoic chamber are generally covered with radiation absorbent material (RAM) 320. The CATR system will have absorbing material to avoid reflections from walls (spillover) and leakage, for example, from a signal generator and internal circuitry.

Lastly, the downhole tool 300 may have a coupler 322 to connect or couple the body to a deployment extension that lowers the downhole tool into the wellbore. The coupler 322 may include bolting, a loop, clamps, or cable. The deployment extension may be a wireline or coiled tubing.

Figure 4:
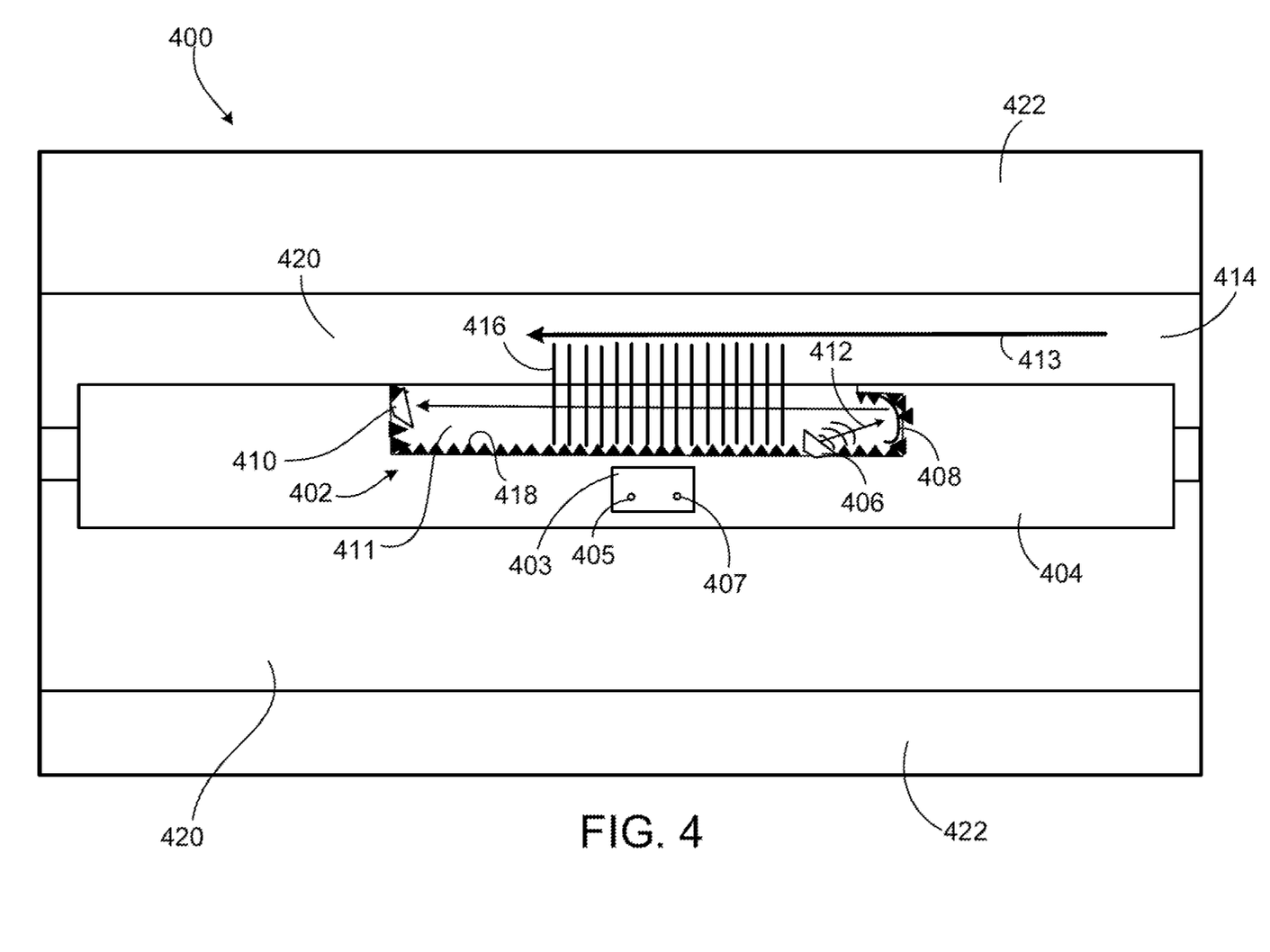
FIG. 4 is a diagram of a downhole tool disposed in a wellbore to measure a property of fluid in the wellbore.

FIG. 4 is a downhole tool 400 disposed in a wellbore 420. In the illustrated example, the wellbore 420 is a horizontal wellbore. The downhole tool 400 may also be applied to vertical or deviated wellbores. The downhole tool 400 may be deployed or lowered into the wellbore 420 via a wireline or coil tubing. The downhole tool 400 may monitor or measure properties of fluid flowing through the wellbore.

The downhole tool 400 has a cavity 402 in a body 404 having a metal housing. In implementations, the cavity 402 may be considered an open or partially-exposed cavity in that the housing is interrupted along the outer side of the cavity 402. The downhole tool 400 has a CATR system disposed in the cavity 402 including a source antenna 406, metallic reflector 408, and a receiver antenna 410. The source antenna 406 may be, for example, a horn antenna or aperture antenna. Further, a signal generator may be associated with the source antenna 406. The signal generator may be an RF signal generator for the wave range (for example, millimeter or microwave) specified for the CATR system. In addition, a spectrum analyzer may be disposed at the receiver antenna 410. The downhole tool 400 may have internal circuitry 403 for emission and processing of the EM waves 412, including inversion, for example, of a S21 coefficient for measurement of complex permittivity of the fluid 414 in the wellbore. As for generation of the complex S21 signal, the feed antenna 406 may be connected to a port (1) 405 of the circuitry 403. The S21 signal may be the transmitted energy to the receiver antenna 410 connected to a port (2) 407 of the circuitry 403.

The circuitry 403 may include processors to perform calculations, for example, to invert for the permittivity. The downhole tool 400 can also have memory to save raw measurement results. The processor and executed code stored in memory can transmit data, such as through mud pulses.

The metallic reflector 408 may be parabolic or hyperbolic, and with edge treatment. In some implementations, an overhanging lip may protect the metal reflector 408 from damage or movement. The receiver antenna 410 is in the plane wave zone 411 called the quiet zone.

In operation, the source antenna emits EM waves 412 which are reflected by the reflector 408 and detected by the receiver antenna 410. In the illustrated embodiment, the direction of the reflected EM plane waves 416 is parallel to the flow 413 of the wellbore fluid 414. In another embodiment, the EM plane waves 416 are perpendicular to the flow 413 of wellbore fluid 414. In either case, the downhole tool 400 via the CATR system measures properties (for example, permittivity) of the fluid 414 (for example, drill mud or production fluids) flowing through the wellbore 420. The EM waves 412 have a wavelength, for example, in microwave range or millimeter range, and with the associated frequency. The fluid 414 may be a fluid such as drilling mud or production fluid, or any type of fluid usually present in a wellbore. The determined or measured properties can include, for example, permittivity or complex permittivity, and other types of properties determined from detectable properties associated with the wellbore condition. The plane wave 416 may be analogous in far field of the antenna but facilitating a more accurate inversion in the CATR. In the physics of wave propagation, a plane wave or planewave may be a wave whose wavefronts (surfaces of constant phase) are infinite parallel planes in theory.

As mentioned, the downhole tool 400 may measure permittivity of the fluid 414. In general, the permittivity of the fluid 414 can be measured by a combination of lab and field measurements (including trial measurements), previous well measurements, analytical models, and numerical models. For example, the technique may measure the attenuation and phase of the S21 parameter, and the downhole temperature (for example, via a temperature sensor). These measurements may be considered with respect to laboratory measurements. Interpolating by analytical or numerical models may be implemented. In sum, an approximate result of permittivity can be obtained. Also, by performing several measurements in different wells, one can establish a baseline for the drill mud or for certain rocks (including for wells in which core plugs are available). Then, any deviation from the baseline can be evaluated. In the case of kick detection, the permittivity of a gas may reduce the overall permittivity of the drill mud, producing a noticeable deviation from the baseline signature.

The cavity 402 has EM wave absorbent material 418 disposed on walls of the cavity 402 such that the cavity 402 is an anechoic chamber or partial anechoic chamber. Again, the downhole tool 400 is disposed in a wellbore 420 in a geological (rock) formation 422. The rock formation 422 side of the cavity 402 may generally not be covered with absorbing material 418. However, given the frequencies employed by the downhole tool 400, decay and reflection losses are expected with respect to the formation 422. Therefore, the cavity 402 may approach an anechoic chamber. Typically, a CATR system will have absorbing material to avoid reflections from walls (spillover) and leakage, for example, from a signal generator and internal circuitry. The EM radiation absorbent material 418 may be called RF absorbers. A typical RF absorber is a lossy material shaped to allow for incoming electromagnetic waves to penetrate without reflections. Once the EM energy travels inside the material, the RF energy may transform into thermal energy and dissipate into surrounding fluid. The electrical thickness of the material may determine or provide for how much energy is absorbed.

In some cases, when the downhole tool 400 measures or detects a change in permittivity due to gas invasion (kick), the downhole tool 400 may send an alarm signal up the wellbore to the surface to alert the drilling operator. Such an alert may give personnel adequate time to shut-in the well and initiate kick management. The alert can also be tied to a control system that automatically implements kick management in response to the alert.

Figure 5:
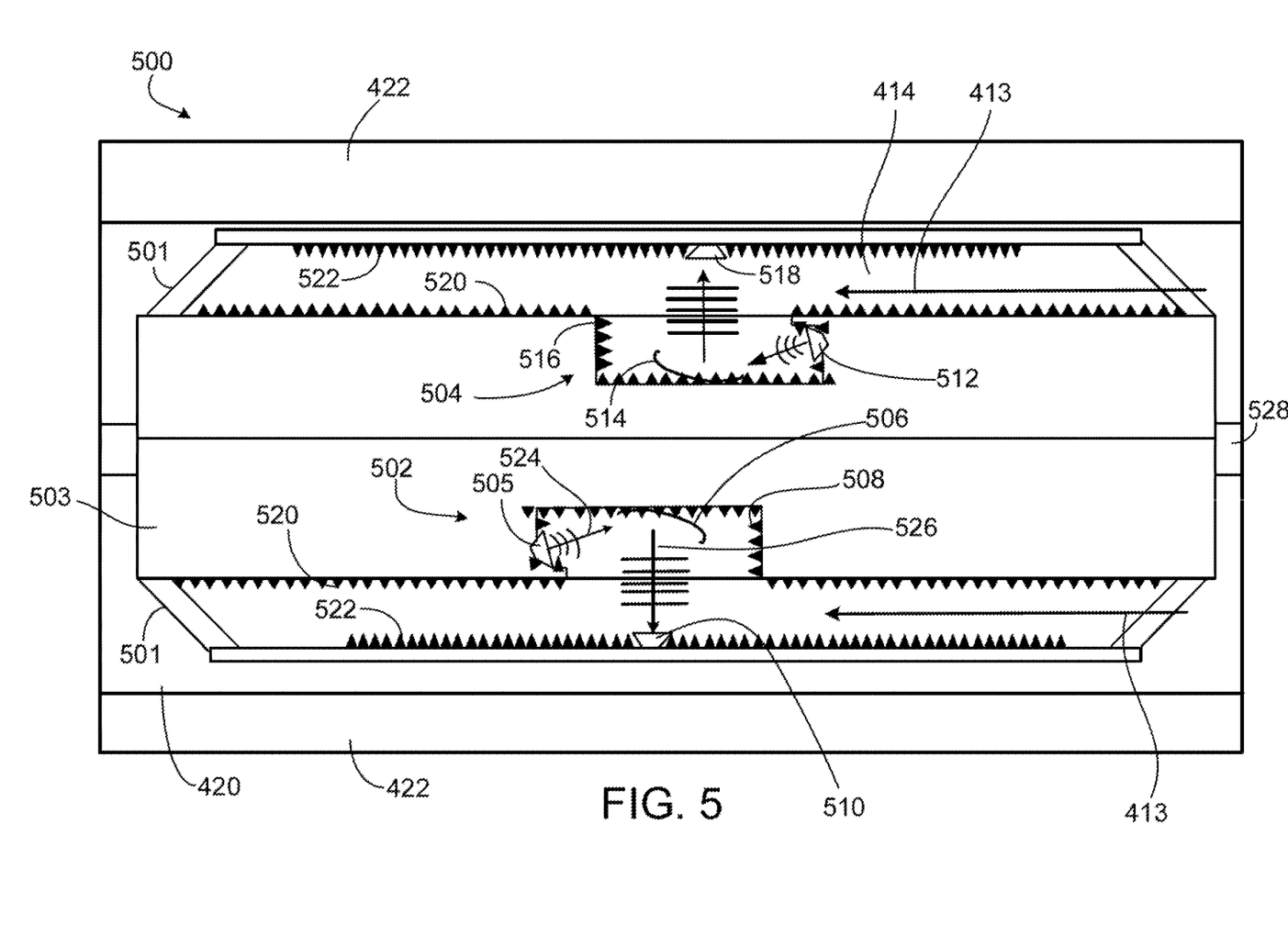
FIG. 5 is a diagram of a downhole tool having a pseudo conduit and disposed in a wellbore to measure a property of fluid in the wellbore.

FIG. 5 is a downhole tool 500 depicted deployed in a horizontal wellbore 420 to monitor or measure a property of wellbore fluid 414 (for example, flowing through the wellbore 420). The downhole tool 500 has an extension 501 around a main body 503. The extension 501 forms a pseudo conduit for receipt of flow 413 of fluid 414. The fluid 414 may be wellbore fluid 414 flowing through the wellbore 420, such as drilling fluid or production fluid. The downhole tool 500 includes two CATR systems for measuring properties (for example, complex permittivity) of the fluid 414. A reason to have two CATR systems is that a two CATR configuration may measure two opposite sides of the well. In contrast, a single CATR system may generally face one particular direction or side of the well.

The two CATR systems include a first cavity 502 and a second cavity 504, respectively, formed in the main body 503. The first CATR system includes a source antenna 505, metal reflector 506, EM radiation absorbent material 508 disposed on first cavity 502 surfaces, and a receiver antenna 510 disposed on the extension 501 inner surface. The second CATR system includes a source antenna 512, metal reflector 514, EM radiation absorbent material 516 disposed on second cavity 504 surfaces, and a receiver antenna 518 disposed on the extension 501 inner surface. The two CATR systems also include radiation absorbent material 520 disposed on the main body 503 exterior surface and radiation absorbent material 522 disposed on the extension 501 inner surface. In operation of the first CATR system, the source antenna emits EM waves 524 that are reflected by the reflector 506 giving reflected EM waves. The reflected EM waves and associated plane wave may be characterized as reflected EM plane waves 526 directed to the receiver 510. The second CATR has the same or similar operation. The downhole tool 500 measures at least one property (for example, permittivity) of the fluid 414 in the wellbore 420. Lastly, an extension 528 from the Earth surface at the wellbore 420 may lower or deploy the downhole tool 500 into the wellbore 420. The extension 528 may be a wireline, drilled rotating pipe, or coiled tubing.

Figure 6:
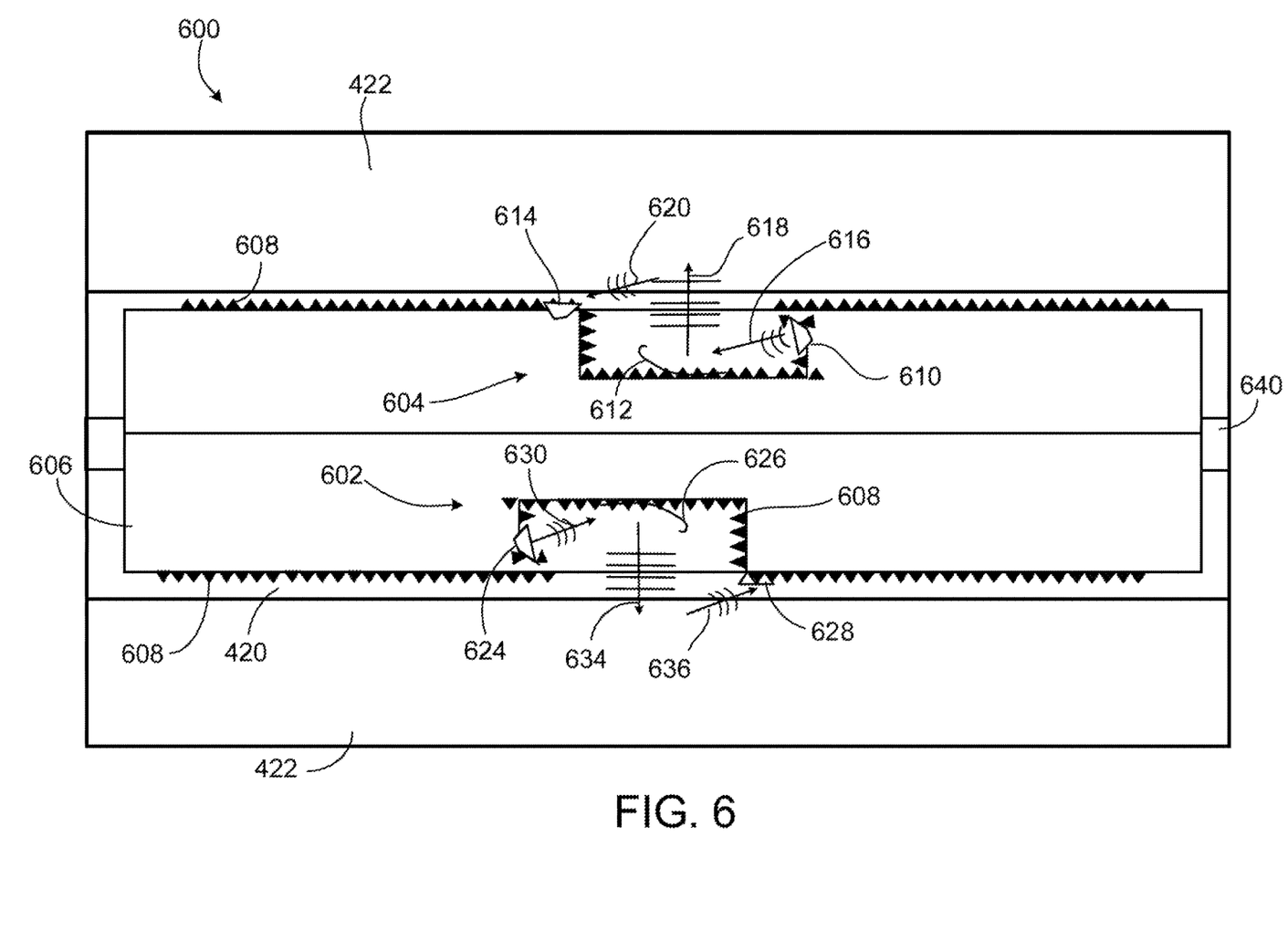
FIG. 6 is a diagram of a downhole tool disposed in a wellbore to measure a property of the geological formation.

FIG. 6 is a downhole tool 600 for formation 422 evaluation. The downhole tool 600 is depicted deployed in a wellbore 420. The downhole tool 600 may be deployed via a wireline similar to a production logging tool. An extension 640 (for example, wireline) from the Earth surface at the wellbore 420 may lower or deploy the downhole tool 600 into the wellbore 420.

The downhole tool 600 includes two CATR systems for monitoring or measuring properties of the formation 422. The two CATR systems include a first cavity 602 and a second cavity 604, respectively, formed in the body 606 of the downhole tool 600. The CATR systems include EM radiation absorbent material 608 disposed on cavity 602, 604 surfaces and on the body 606 outer surface.

The first CATR system of the downhole tool 600 includes a source antenna 610, metal reflector 612, and receiver antenna 614. In operation, the source antenna 610 emits EM waves 616 reflected by the reflector 612 to give EM plane waves 618 directed to the formation 422. The receiver antenna 614 receives EM waves 620 reflected from the formation 422. In the illustrated example, the direction of the EM plane waves 616 are perpendicular to the adjacent surface (face) of the rock formation 422. In other examples, the CATR system can be configured such that the EM plane waves are parallel with the adjacent surface (face) of the rock formation 422.

The second CATR system includes a source antenna 624, metal reflector 626, and receiver antenna 628. In operation, the source antenna 624 emits EM waves 630 reflected by the reflector 626 to give reflected EM plane waves 634 directed to the formation 422. The receiver antenna 628 receives EM waves 636 reflected from the formation 422.

The downhole tool 600 via this operation of its two CATR systems monitors or measures at least one property (for example, complex permittivity) of the rock formation 422. As depicted for this illustrated embodiment, the reflectors 612, 626 are pointed to the formation 422, and the receiver antennae 614, 628 placed within a number of wavelengths for formation 422 evaluation. The downhole tool 640 via its two CATR systems may establish a baseline signal based on the formation 422 region near the wellbore 420, and then detect for changes in this signal due to the presence of water in the formation 422 near the wellbore 420. The downhole tool 600 evaluation, via its CATR system(s), can penetrate the formation 422, such as a few millimeters, to determine or detect any measurable changes in the fluid composition in the formation 422. Such may facilitate to detect water intrusion in a more proactive manner.

Figure 7:
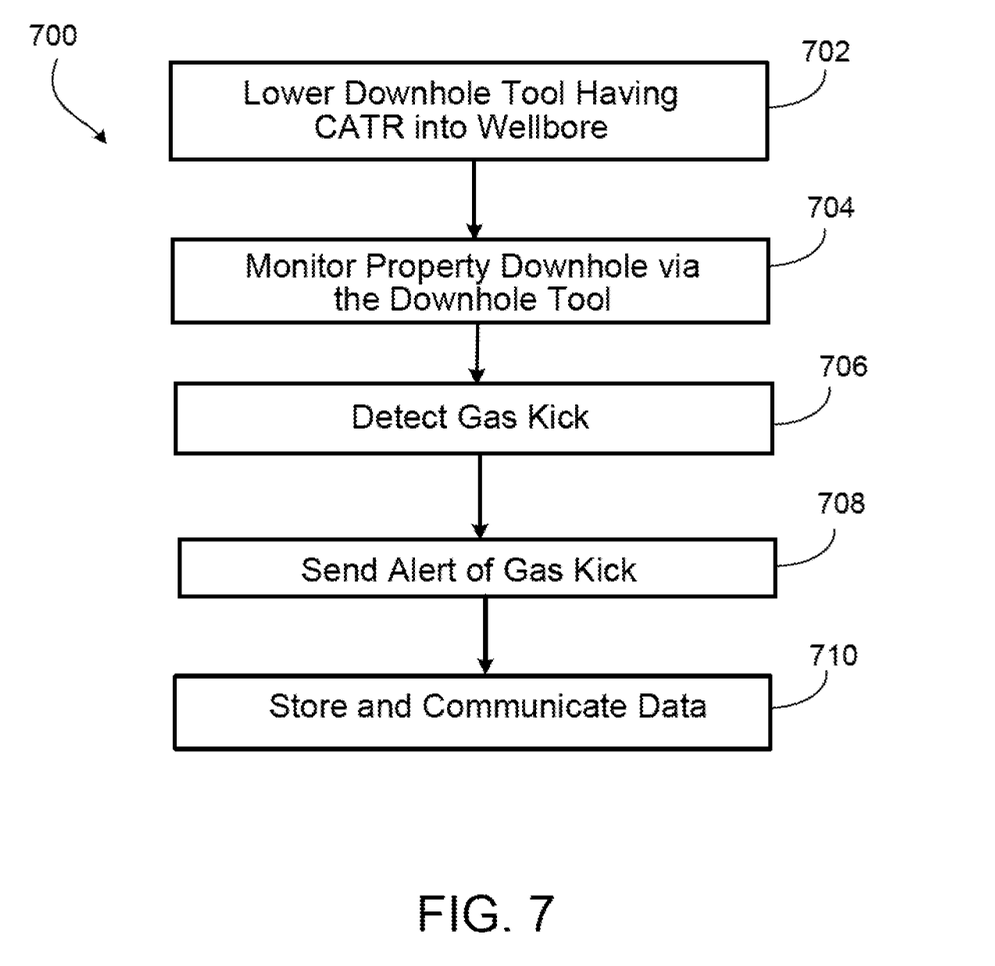
FIG. 7 is a method of downhole monitoring.

FIG. 7 is a method 700 of downhole monitoring. At block 702, the method includes deploying or lowering a downhole tool having a CATR system into a wellbore in a geological formation. The CATR system may include a source antenna, a metal reflector, a receiver antenna, and an EM radiation absorbent material. The metal or metallic reflector may have edge treatment.

At block 704, the method includes monitoring a property downhole in the wellbore via the downhole tool. In certain implementations, the monitoring of the property downhole involves emitting EM waves via a source antenna of the CATR system, the EM waves in the microwave range or millimeter range, or a combination thereof. The property may be permittivity, which may be complex permittivity (relative permittivity). The property may be a wellbore fluid property. The monitoring of the property downhole may include measuring the property (for example, permittivity) of wellbore fluid downhole via the CATR system. The wellbore fluid may be, for instance, drilling fluid or production fluid. The property may be a wellbore fluid property and where direction of the reflected EM plane waves in the CATR are parallel or perpendicular to flow of the wellbore fluid in the wellbore. The property may be a geological formation property. The monitoring of the property downhole may include measuring the property of the geological formation via the CATR system.

In some implementations, the monitoring of the property downhole involves emitting EM waves via a source antenna of the CATR system, and reflecting the EM waves via a metal reflector of the CATR system, wherein direction of reflected EM waves is parallel with flow of wellbore fluid in the wellbore. In those implementations, the property may be a property of the wellbore fluid. On the other hand, in certain embodiments, the property is a geological formation property, wherein a metal reflector of the CATR system faces toward the geological formation, and wherein monitoring the property involves emitting EM waves via a source antenna and reflecting the EM waves via the metal reflector toward the geological formation.

At block 706, the method may include detecting a gas kick via the monitoring of the property or permittivity. For example, the downhole tool may establish a baseline signal associated with the monitored property during normal or typical operation. The detecting of the gas kick may be in response to a signal deviating from the baseline signal. Again, the monitored property may be a property of the wellbore fluid or geological formation, or a combination thereof.

At block 708, the method may include sending an alert via the downhole tool in response to detecting the gas kick. The alert or alarm may be sent to the Earth surface at the wellbore, such as via a wireline or cable. The alert signal may be received by a computing system or control system at the Earth surface, either locally at the well site or remote from the well site. In some embodiments, the detection (block 706) and alert may be characterized as an early detection of the gas kick compared to typical detection of a gas kick without the downhole tool. The alert may give the operator, engineer, or driller adequate time to mitigate or stop the gas kick without experiencing a blowout or without implementing emergency procedures. In a particular embodiment, the alert is fed to a control system that automatically implements an operating change to stop or mitigate the gas kick.

At block 710, the method may include storing data in memory of the downhole tool. The data may be raw data collected by the downhole tool. The data may be processed data (for example, data processed by the downhole tool). The method may also include communicating data to the surface such as to a computing system local at the well site or remote from the well site. In some examples, a telemetry system may be employed to communicate the data from the downhole tool.

In electromagnetism, absolute permittivity (c) may be called permittivity or distributed capacitance and is the measure of ability of material to store an electric field in the polarization of the medium. Example units of absolute permittivity are farad per meter (F/m). The least possible permittivity is that of a vacuum. The permittivity of a material may be a complex frequency-dependent value. This complex permittivity may be called relative permittivity. Relative permittivity of a material is the permittivity of the material expressed as a ratio to the permittivity of vacuum. The relative permittivity of a material for a frequency of zero is known as static relative permittivity. Complex or relative permittivity is a dimensionless number that is a complex-valued with real and imaginary parts. This complex permittivity may be determined or measured by present embodiments of the downhole tool.

The monitoring or measuring of properties such as permittivity, as discussed earlier for the downhole tool with respect to the preceding figures, may rely on a signal generator associated with the source antenna, and on a processor to perform calculations or for signal processing at the receiver antenna. In the processing, an S-parameter(s) or S-parameter coefficient may be inverted. In certain embodiments, the downhole tool performs inversion on the transmission S21 parameter or coefficient to determine permittivity. S-parameters may include transmission (S21) and reflection (S11) parameters or coefficients. Scattering parameters or S-parameters, as elements of a scattering matrix or S-matrix, may describe the electrical behavior of linear electrical networks when undergoing various steady state stimuli by electrical signals. S-parameters change with the measurement frequency, and therefore frequency is generally specified for S-parameter measurements.

A kick may be a flow of formation fluids (for example, oil, gas, or water) into the wellbore during drilling operations. A kick is generally a well-control problem in which the pressure found within the drilled rock is greater than the drilling fluid (drilling mud) hydrostatic pressure acting on the borehole or rock face. When this occurs, the greater formation pressure has a tendency to force formation fluids into the wellbore. This forced fluid flow may be called a kick. If the flow is successfully controlled, the kick may be considered to have been killed. An uncontrolled kick that increases in severity may result in what is known as a blowout. A kick may be labeled as an oil kick, water kick, or gas kick. If gas enters the borehole, the kick may be called a gas kick.

As indicated, kicks may occur as a result of formation pressure being greater than mud hydrostatic pressure, which causes fluids to flow from the formation into the wellbore. In drilling operations, the operator typically attempts to maintain a hydrostatic pressure greater than formation pressure and, thus, prevent kicks. Yet, on occasion, the formation may exceed the mud pressure and a kick may occur. Insufficient mud weight may be a typical cause of kicks. In particular, a permeable zone may be drilled with a mud weight that exerts less pressure than the formation pressure within the zone. In that case, the formation pressure exceeds the wellbore pressure and thus fluids may begin to flow from the formation into the wellbore and the kick occurs. Abnormal formation pressures (greater pressures than normal conditions) are often associated with causes for kicks.

Lastly, implementations may employ manage pressure drilling (MPD) and logging while drilling (LWD) tools such as neutron, acoustic logging, and induction tools. The MPD system is a closed system based on the principle of balancing the equivalent circulating pressure to formation pressure. A typical deep-water kick detection system (DKD) generally relies on many measurements to be feed to the MPD system and is dependent on the accuracy of those measurements. LWD tools may provide information about the changes in density in the drill mud. However, density measurements may suffer if the drill string is sliding in at an angle or into a horizontal borehole. Nuclear magnetic resonance (NMR) LWD tools may be costly to run and unfortunately sensitive to drill string movement. Acoustic LWD tools in principle should work in water-based mud (WBM), given the differences in density between water and pressurized gas. Yet, acoustic LWD tools have many challenges such as eliminating drill noise from their measurements, and mounting the transmitters and receivers without compromising their reliability and data processing issues. Resistivity LWD tools are generally not employed for kick detection. Resistivity LWD tools employ low frequency signals (for example, 2 MHz) emitted from a loop antenna in the OD of the drill collar. Resistivity LWD tools exhibit uncertainty in the wellbores in general due to the wavelength and frequency of the wave signals. Conventional LWD tools may have uncertainty in the measurements. Dielectric formation logging tools consist of dipole sources and an array of receivers. Also, resistivity logging tools utilize frequency coil sources and coil receivers. Both techniques do not offer antenna directivity but offer an average of the area penetrated.

In summary, an embodiment is a method of downhole monitoring, including lowering a downhole tool having a CATR system into a wellbore in a geological formation. The method includes monitoring a property (for example, permittivity) downhole in the wellbore via the downhole tool. The method may include detecting a gas kick via the monitoring of the property. The monitoring the property downhole may involve emitting EM waves via a source antenna of the CATR system. The EM waves may be microwave range or millimeter range, or a combination thereof. The EM waves may be reflected via a metal reflector of the CATR system. The direction of the reflected EM plane waves can be parallel or perpendicular to flow of wellbore fluid in the wellbore. The wellbore fluid may include drilling fluid or production fluid. The property monitored or measured may be a wellbore fluid property, such as complex permittivity of the wellbore fluid. The monitored property may be a geological formation property, wherein a metal reflector of the CATR system faces toward the geological formation, and wherein monitoring the property involves emitting EM waves via a source antenna of the CATR system and reflecting the EM waves via the metal reflector toward the geological formation. The CATR system may include a source antenna, a metal reflector, a receiver antenna, and EM radiation absorbent material. The reflector may be a metallic reflector having edge treatment.

Another embodiment is a method of downhole monitoring, including deploying a downhole tool having a CATR system into a wellbore in a geological formation. The CATR system includes a source antenna, a metallic reflector, a receiver antenna, and EM radiation absorbent material. The metallic reflector may have edge treatment. The method includes monitoring permittivity (for example, relative permittivity) downhole in the wellbore via the downhole tool. The method may include detecting a gas kick via the monitoring of the permittivity, and sending an alert via the downhole tool in response to detecting the gas kick. The monitoring of permittivity downhole may include emitting EM waves via the source antenna at microwave range or millimeter range, or a combination thereof. The monitoring of permittivity downhole may include measuring permittivity of wellbore fluid downhole via the CATR system. The monitoring of permittivity downhole may include measuring permittivity of the geological formation via the CATR system.

Yet another embodiment is a downhole tool having a body and a coupler to connect the body to a deployment extension that lowers the downhole tool into the wellbore. The deployment extension may be, for example, a wireline or coiled tubing. The downhole tool has a CATR system associated with the body to measure permittivity downhole in the wellbore. The downhole tool may have a processor to facilitate detection of a gas kick via the CATR system and to send an alert of the gas kick. The CATR system includes a source antenna, a metallic reflector, a receiver antenna, and EM radiation absorbent material. The source antenna is configured to emit EM waves in microwave range or millimeter range, or a combination thereof. The metallic reflector may have edge treatment, and wherein the metallic reflector may be a parabolic reflector or a hyperbolic reflector. In implementations, the edge treatment may include a serrated edge or a rolled edge, or a combination thereof. The receiver antenna may be disposed in a plane wave zone that is a quiet zone of the CATR system. The EM radiation absorbent material be wedge shapes or pyramid shapes. Lastly, the CATR system may incorporate an anechoic chamber (or partial anechoic chamber) having the EM radiation absorbent material.

A number of implementations have been described. Nevertheless, it will be understood that various modifications may be made without departing from the spirit and scope of the disclosure.

What is claimed is:

1. A method of downhole monitoring, comprising:
   lowering a downhole tool comprising a compact antenna test range (CATR) system into a wellbore in a geological formation;
   monitoring a property downhole in the wellbore via the downhole tool; and
   detecting a gas kick via the monitoring of the property.

2. The method of claim 1, wherein the property comprises permittivity, and wherein the CATR system comprises a metallic reflector comprising edge treatment.

3. The method of claim 1, wherein the CATR system comprises a source antenna, a metal reflector, a receiver antenna, and EM radiation absorbent material.

4. The method of claim 1, wherein monitoring the property downhole comprises:
   emitting EM waves via a source antenna of the CATR system; and
   reflecting the EM waves via a metal reflector of the CATR system, wherein direction of reflected EM plane waves is parallel with flow of wellbore fluid in the wellbore.

5. The method of claim 4, and wherein the property comprises complex permittivity of the wellbore fluid, and wherein the wellbore fluid comprises drilling fluid or production fluid.

6. The method of claim 1, wherein monitoring the property downhole comprises emitting EM waves via a source antenna of the CATR system, the EM waves comprising microwave range or millimeter range, or a combination thereof.

7. The method of claim 1, wherein the property comprises a geological formation property, wherein a metal reflector of the CATR system faces toward the geological formation, and wherein monitoring the property comprises emitting EM waves via a source antenna of the CATR system and reflecting the EM waves via the metal reflector toward the geological formation.

8. A method of downhole monitoring, comprising:
lowering a downhole tool comprising a compact antenna test range (CATR) system into a wellbore in a geological formation; and
monitoring a property of a wellbore fluid downhole in the wellbore via the downhole tool, wherein direction of reflected electromagnetic (EM) plane waves in the CATR is parallel or perpendicular to flow of the wellbore fluid in the wellbore.

9. A method of downhole monitoring, comprising:
deploying a downhole tool comprising a compact antenna test range (CATR) system into a wellbore in a geological formation, wherein the CATR system comprises a source antenna, a metallic reflector, a receiver antenna, and electromagnetic (EM) radiation absorbent material;
monitoring permittivity downhole in the wellbore via the downhole tool;
detecting a gas kick via the monitoring of the permittivity; and
sending an alert via the downhole tool in response to detecting the gas kick.

10. The method of claim 9, wherein the permittivity comprises relative permittivity, and wherein the metallic reflector comprises edge treatment.

11. The method of claim 9, wherein monitoring permittivity downhole comprises emitting EM waves via the source antenna at microwave range or millimeter range, or a combination thereof.

12. The method of claim 9, wherein monitoring permittivity downhole comprises measuring permittivity of wellbore fluid downhole via the CATR system.

13. The method of claim 9, wherein monitoring permittivity downhole comprises measuring permittivity of the geological formation via the CATR system.

14. A downhole tool comprising:
a body;
a coupler to connect the body to a deployment extension that lowers the downhole tool into the wellbore;
a compact antenna test range (CATR) system associated with the body to measure permittivity downhole in the wellbore, wherein the CATR system comprises a source antenna, a metallic reflector, a receiver antenna, and electromagnetic (EM) radiation absorbent material and
a processor to detect a gas kick via the CATR system and to send an alert of the gas kick.

15. The downhole tool of claim 14, wherein the source antenna to emit EM waves in microwave range or millimeter range, or a combination thereof.

16. The downhole tool of claim 14, wherein the deployment extension comprises a wireline or coiled tubing.

17. The downhole tool of claim 14, wherein the CATR system comprises an anechoic chamber comprising the EM radiation absorbent material.

18. The downhole tool of claim 17, wherein the EM radiation absorbent material comprises wedge shapes or pyramid shapes.

19. The downhole tool of claim 14, wherein the metallic reflector comprises edge treatment, and wherein the metallic reflector comprises a parabolic reflector or a hyperbolic reflector.

20. The downhole tool of claim 19, wherein the edge treatment comprises a serrated edge or a rolled edge, or a combination thereof.

21. A downhole tool, comprising:
a body;
a coupler to connect the body to a deployment extension that lowers the downhole tool into the wellbore; and
a compact antenna test range (CATR) system associated with the body to measure permittivity downhole in the wellbore, wherein the CATR system comprises a source antenna, a metallic reflector, a receiver antenna, and electromagnetic (EM) radiation absorbent material, wherein the receiver antenna is disposed in a plane wave zone comprising a quiet zone of the CATR system.

* * * * *

UNITED STATES PATENT AND TRADEMARK OFFICE
CERTIFICATE OF CORRECTION

PATENT NO.         : 10,865,640 B2                                  Page 1 of 1
APPLICATION NO.    : 16/380806
DATED              : December 15, 2020
INVENTOR(S)        : Jose Oliverio Alvarez It is certified that error appears in the above-identified patent and that said Letters Patent is hereby corrected as shown below:

In the Claims

In Column 16, Line 12, Claim 14, after "material" please insert -- ; --

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*